United States Patent
Hubscher et al.

(10) Patent No.: US 7,420,385 B2
(45) Date of Patent: Sep. 2, 2008

(54) SYSTEM-ON-A-CHIP PIPELINE TESTER AND METHOD

(75) Inventors: Ronald A. Hubscher, Santa Rosa, CA (US); Jason L. Smith, Santa Rosa, CA (US); Frank E Hamlin, Santa Rosa, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 179 days.

(21) Appl. No.: 11/294,712

(22) Filed: Dec. 5, 2005

(65) Prior Publication Data

US 2007/0126448 A1    Jun. 7, 2007

(51) Int. Cl.
   *G01R 31/26*   (2006.01)
(52) U.S. Cl. .................................................... 324/765
(58) Field of Classification Search .................. 324/765
   See application file for complete search history.

(56) References Cited

U.S. PATENT DOCUMENTS

| | | | | |
|---|---|---|---|---|
| 3,039,604 A * | 6/1962 | Bickel et al. ................. | 209/556 |
| 4,636,726 A * | 1/1987 | Santomango et al. ....... | 324/755 |
| 5,313,156 A * | 5/1994 | Klug et al. ................. | 324/158.1 |
| 5,805,472 A * | 9/1998 | Fukasawa ................... | 702/118 |
| 5,865,319 A * | 2/1999 | Okuda et al. ................. | 209/574 |
| 6,137,303 A * | 10/2000 | Deckert et al. .............. | 324/765 |
| 6,507,203 B1 * | 1/2003 | Hirschmann ................ | 324/754 |
| 6,731,127 B2 * | 5/2004 | Watts .......................... | 324/765 |
| 6,815,967 B2 * | 11/2004 | Bjork .......................... | 324/765 |
| 6,882,141 B2 * | 4/2005 | Kim ......................... | 324/158.1 |
| 6,897,670 B2 * | 5/2005 | Burns .......................... | 324/758 |
| 7,151,388 B2 * | 12/2006 | Gopal et al. ................. | 324/765 |

* cited by examiner

*Primary Examiner*—Ha Nguyen
*Assistant Examiner*—Karen M Kusumakar
(74) *Attorney, Agent, or Firm*—Holland & Hart, LLP

(57) ABSTRACT

A pipeline tester is disclosed that is capable of testing systems-on-a-chip (SOCs) or Devices Under Test (DUTs) in pipeline fashion. The tester provides faster, more economical testing of such SOCs and DUTs, which are loaded sequentially into the tester. A plurality of underlying test stations are disposed in the tester. Above the test stations are disposed corresponding test fixtures which are configured to receive moveable test beds therein. The test beds are mechanically and electrically connected to the underlying test stations. Loaded within each test bed is an SOC or DUT on which one or more electrical or electronic tests are performed. Once the test has been completed, the test bed is moved to another test station, where another electrical or electronic test is performed.

35 Claims, 6 Drawing Sheets

SYSTEM-ON-A-CHIP PIPELINE TESTER AND METHOD

FIELD OF THE INVENTION

This invention relates to the field of devices, systems and methods for testing electronic circuits by applying and measuring electrical signals, and more particularly to components, devices, systems and methods for pipeline testing of system-on-a-chip (SOC) or other integrated circuits.

BACKGROUND

To ensure proper functionality and reliability, manufacturers typically test SOC integrated circuits (ICs) before shipping SOC ICs to customers. One system commonly employed to test SOC ICs is the Agilent 93000 SOC Tester, which supports concurrent tests. Portions of the Agilent 93000 SOC Tester are described in U.S. Pat. No. 6,756,778 to Hirschmann entitled "Measuring and/or calibrating a Test Head;" U.S. Pat. No. 5,558,541 to Botka et al. entitled "Blind Mate Connector for an Electronic Circuit Tester;" and U.S. Pat. No. 5,552,701 to Veteran et al. entitled "Docking System for an Electronic Circuit Tester."

As illustrated in FIGS. 1 and 2, Agilent 93000 Tester 100 comprises test head 110 with DUT (Device under test) interface 120, manipulator 130 for positioning test head 110, DUT board 150 which plugs into underlying DUT interface 120, support rack 140 for supplying test head 110 with electrical power, cooling water and compressed air (not shown in the Figures) and a computer workstation (not shown in the Figures) which serves as the user interface to Tester 100.

Test head 110 comprises tester electronics and additional analog modules. In past, test head 110 has been configured with 512 pins or 1024 pins. The 512 pin test head supports 4 card cages while the 1024 pin test head supports 8 card cages. Each card cage can contain 8 digital boards or 8 analog modules, respectively. A single board has 16 pins, making 128 pins per cage. Therefore, the 4-cage test head contains 512 pins and the 8-cage test head 1024 pins. The DUT is mounted on DUT board 150, which is connected to the I/O channels by DUT interface 120. DUT interface 120 consists of high performance coax cabling and spring contact pins (pogo pins) which establish electrical connection with DUT board 120.

DUT interface 120 provides docking capabilities to handlers and wafer probers. The docking mechanism is controlled by compressed air (not shown in the Figures), and if required may also be operated manually. Test head 110 is water-cooled and receives its cooling water supply from support rack 140, which in turn is connected by two flexible hoses to the cooling unit (not shown in the Figures).

General-purpose manipulator 130 supports and positions test head 110. Manipulator 130 provides 6 degrees of freedom for precise and repeatable connections between test head 100 and handlers or wafer probers. Support rack 140 is attached to manipulator 130 and serves as the interface between test head 110 and AC power, cooling water and compressed air. Tester 100 may also comprise additional support racks such as analog support racks for installing additional analog instruments.

An HP-UX workstation (not shown in the Figures) may serve as the interface between the user and tester 100. At the present time, Agilent 93000 SOC Series SmarTest software runs on the HP-UX workstation under the HP-UX operating system, although other suitable operating systems such as Linux or other workstations may certainly be used. SmarTest allows setups and test data to be downloaded to the test system, and further permits editing of such information. All testing is carried out in the test system. Results are read back by the workstation and displayed on the monitor. During test program execution, upload and download are typically not required since the test processors act independently from the workstation once the test program has begun running.

On the workstation, a diagnostic program can be run to check the system periodically or to identify the source of a problem. Configuration of Tester 100 involves assigning digital channel boards, power supplies, and analog instruments to specific channels of the test head and providing for associated mainframe components (such as an alternate master clock (AMC)) external to the test head.

Test head electronics components supply power to the various DUTs and perform measurements. Some test head functions and key elements are as follows:

DC/DC conversion and distribution of supply voltages
Interfacing via fiber optical cable to the workstation
Internal communication via data bus, address bus, and control bus
Communication clock generation and distribution
Master clock generation and distribution
High precision parametric measurement unit (HPPMU)
Interfacing to external clock
Supplying power to the DUT
Making channel measurements Such flexibility in Tester 100 allows for on-the-fly grouping of pins into virtual ports to test target IP blocks. As a result, the platform is capable of testing multiple blocks concurrently. Once a test has been completed, tester pins may be immediately reconfigured and assembled into new port configurations to conduct a completely different set of tests.

The architecture of Tester 100 provides support for concurrent tests on potentially dozens of ports with different sequencing and digital data rates. The test-processor-per-pin architecture of Tester 100 allows it to function as a scalable platform. Tester 100 supports test technologies that include RF, analog, digital and mixed signal, each fully capable of being used concurrently.

FIG. 2 illustrates the placing of DUT 160 on packaged parts DUT board 150, and the positioning of DUT board 150 above test head 110.

One of the most expensive components of manufacturing an integrated circuit or chip is "cost of test." Consequently, increasing the throughput of Tester 100 becomes imperative in reducing cost. Increasing throughput in an economic manner has proven easier said than done, however. To date, the principal methods employed to utilize tester 100's resources efficiently and cost-effectively have been: (a) parallel test; (b) concurrent test and (c) strip test.

Parallel test methods permit multiple DUTs to be tested simultaneously, typically on four different sites. The biggest problem characterizing parallel test techniques is that sufficient resources must be available to operate simultaneously all sites, and that at any given moment during testing most resources are not being actively utilized. Consequently, the time to test a chip is the amount of time required to run a full test plan. A performance increase of "num sites×time of complete test-plan" results.

Concurrent test methods permit several tests to be performed on a DUT simultaneously. DUTs amenable to concurrent test methods, however, usually must be designed with concurrent tests in mind. Resources are usually better utilized in concurrent tests than in Parallel tests, and can result in significantly shortened test times. Several drawbacks to concurrent test methods exist: Not all tests may be run concurrently; concurrent testing requires greater up-front investment in equipment to design DUTs amenable to concurrent testing; many chip diagrams generally do not lend themselves to "design for concurrent test;" and "designing for concurrent test" may lead to less-than-optimal chip design.

Strip test methods do not involve using tester resources in some superior fashion, but in using a handler more efficiently through reducing index handler time. The distance a handler moves between DUTs mounted on a strip is minimal while between strips handler index time remains constant. In strip testing, some preprocessing and post handler processing of DUTs is required. Strip test methods require DUT binning that must be done after testing has been completed. Much information must also be processed to properly bin tested DUTs.

In summary, a review of current test options shows that parallel test methods are capable of testing DUTs at a rate up to about four times that of conventional methods but require quite complex systems; strip test methods merely reduce handler index times; and concurrent test methods have hidden design costs and other tradeoffs.

What is needed is an improved method of testing SOCs that results in faster testing at lower cost, where the improved method can function in combination with older testers, other equipment and methods.

SUMMARY OF THE INVENTION

In a first aspect of the present invention, there is provided a system-on-a-chip pipeline tester comprising a plurality of test stations, each station being configured to conduct one or more tests on a system-on-a-chip, a plurality of test fixtures, each test fixture corresponding to a predetermined test station and being electrically and mechanically attachable thereto, a plurality of test beds, each test bed being configured to receive at least one DUT, each test bed corresponding to a predetermined test fixture and being electrically and mechanically attachable thereto; wherein the tester is configured to pipeline test a plurality of DUTs loaded into the test beds.

In a second aspect of the present invention, there is provided a pipeline test module for use in conjunction with a system-on-a-chip pipeline tester, the module comprising a load board, at least one load board rail attached to the load board, a plurality of test fixtures, each test fixture being attached to the load board, a plurality of test beds, each test bed being configured to receive at least one DUT therein and further being configured to mechanically and electrically engage the test fixtures, wherein the module is configured to engage a plurality of corresponding test stations in a tester.

In a third aspect of the present invention, there is provided a method of pipeline testing a plurality of DUTs using a system-on-a-chip pipeline tester, the method comprising loading a first DUT in a first test bed, loading the first test bed in the tester, moving the first test bed to a first test station, performing a first electrical or electronic test on the first DUT at the first test station, moving the first test bed to a second test station, loading a second DUT in a second test bed, moving the second test bed to the first test station, performing the first electrical or electronic test on the second DUT at the first test station, and performing a second electrical or electronic test on the first DUT at the second test station.

BRIEF DESCRIPTIONS OF THE DRAWINGS

The foregoing and other aspects of the invention will become apparent after having read the detailed description of a preferred embodiment of the invention set forth below and after having referred to the following drawings, in which like reference numerals refer to like parts:

DETAILED DESCRIPTION OF PREFERRED EMBODIMENTS

Figure 1:
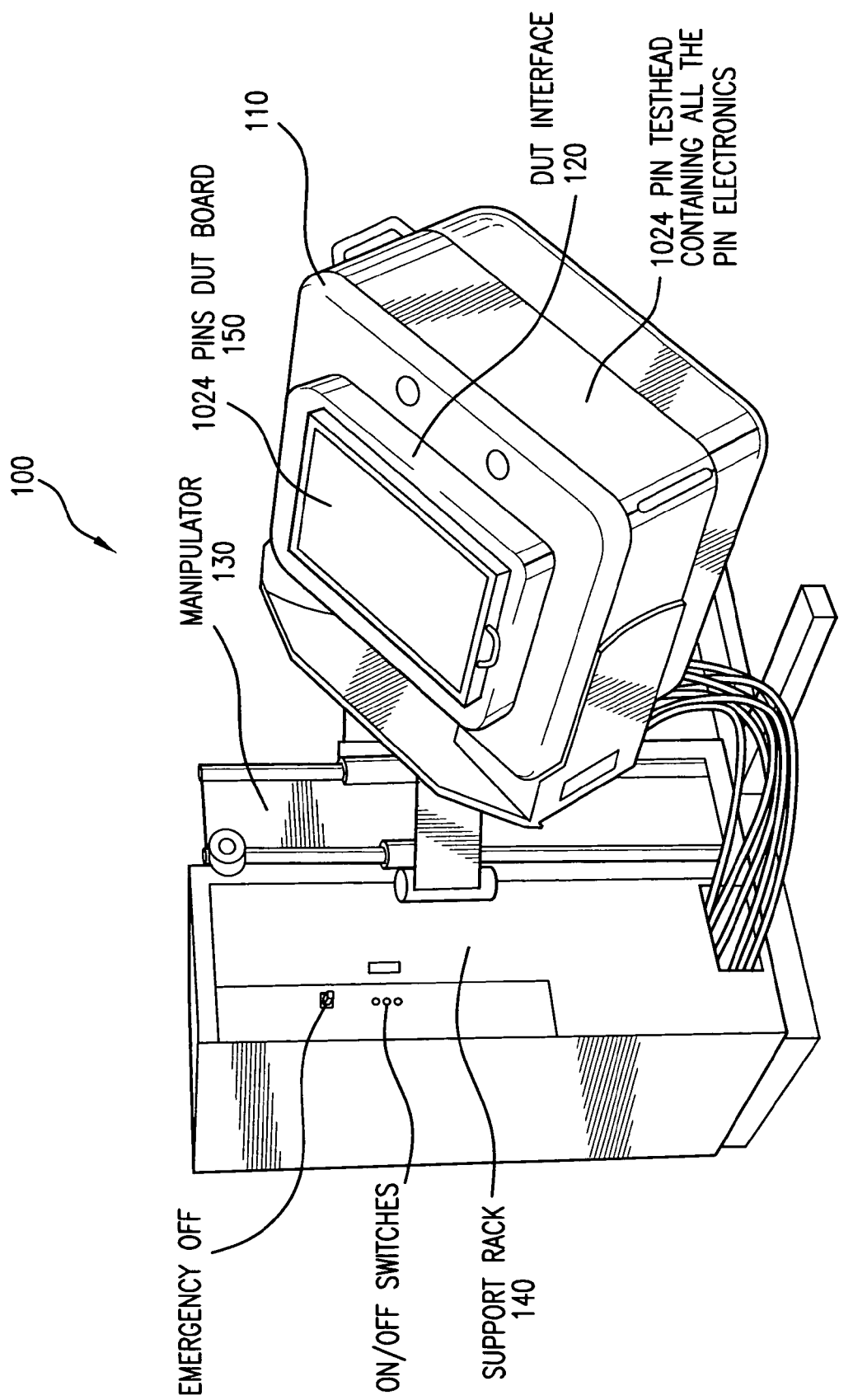
FIG. 1 shows a prior art Agilent 93000 SOC Tester.
Figure 2:
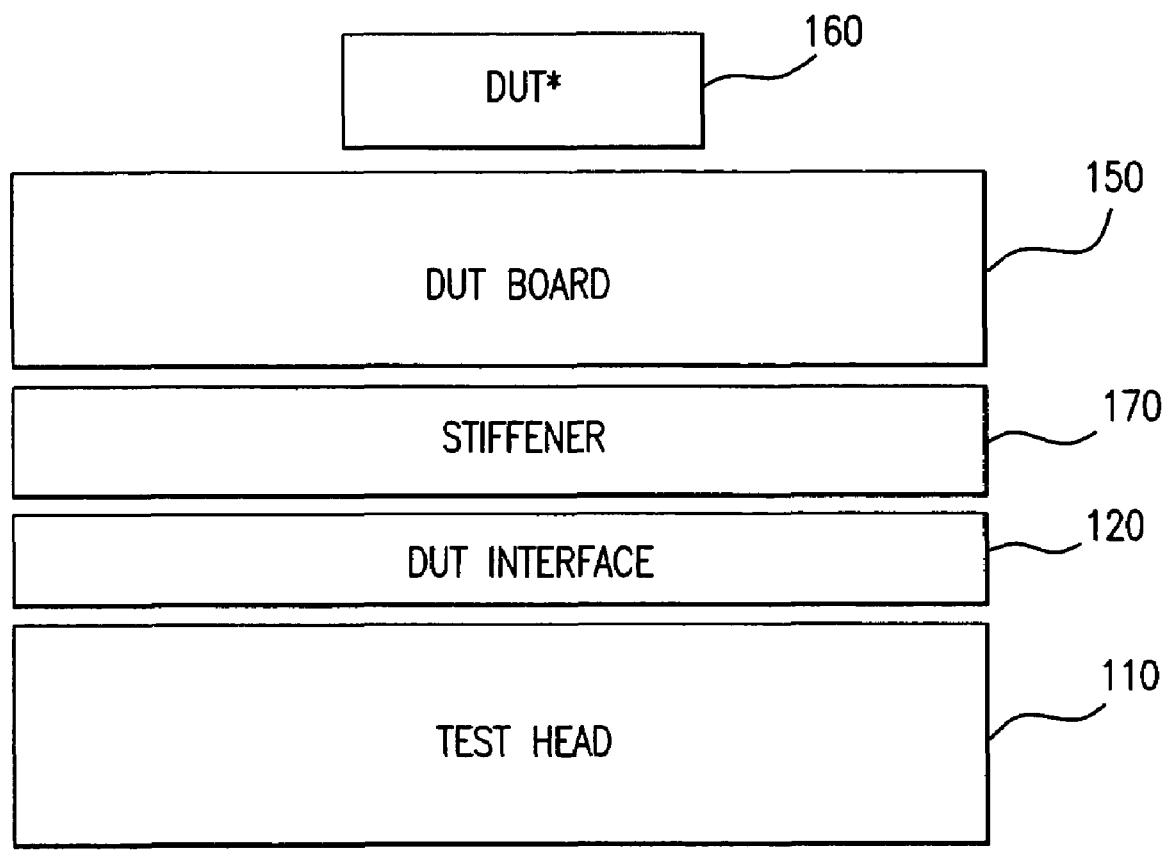
FIG. 2 shows a schematic cross-section of prior art DUT and DUT board connections to a test head of an Agilent 93000 SOC Tester.

The term "electrical and/or electronic testing" means electrical and/or electronic tests carried out by machines such as, by way of example only, the Agilent 93000 Tester described hereinabove.

Pipeline testing in conformance with the teachings of the present invention may be likened to an assembly line for testing SOCs or DUTs. A complete plan for testing a given DUT is preferably broken up into logical sections. Each logical section is then performed on a separate test station connected to a load board. The test stations are placed on or connected linearly to the load board so that a simple line handler can pass DUTs loaded in test beds from one test station to another. In a preferred embodiment of the present invention, all test stations are configured to perform their individual tests on their DUTs, except at designated loading and unloading stations, where testing may or may not occur. All test stations test at the same time (concurrently). Some stations may not perform their set of tests depending on the previous pass/fail state of the DUT at that station.

Using such a methodology, the Test Interval is no longer limited by the overall time of the DUT test plus handler index time, but is instead limited by the average time of the longest or slowest test segment (plus the line-handler index time). The time length of such a segment will always be less than the time of the total test plan. The additional handler time will always be less than the time required by a conventional handler. Thus, the pipeline testing methods and devices of the present invention result in faster test times.

The various embodiments of tester 100 of the present invention contain between 1 and n test stations and between 1 and n corresponding fixtures, more about which we say below. In preferred embodiments of the present invention, each test station performs one test among a series of tests that are to be conducted on each DUT or SOC, although it is to be understood that a single test station may be configured to conduct more than one test on an SOC or DUT.

Test beds 220 of the present invention hold DUTs 160 or SOCs 160 and provide an electrical and mechanical interface between each DUT 160 and underlying fixture 210, which in turn is electrically and mechanically connected to a corresponding test station 190 of tester 100. Each test bed 220 maintains the provision of electrical power and other signals to its corresponding DUT 160 while test bed 220 is being moved from one test station 190 or fixture 210 to another. Each fixture 210 engages a corresponding test bed 220 and interfaces an underlying test station 190 to test bed 220 and corresponding DUT 160. Spring-loaded ball electrical contacts or pads are preferably disposed atop each test station to establish electrical contact with overlying fixtures 210.

One or more handlers 230 place DUTs 160 in test beds 220, load test beds and DUTs 160 at loading station 240, move test beds 220 and DUTs 160 within pipeline test module 290 as one or more tests are completed at each test station 190, unload test beds 220 and DUTs 160 from pipeline test module 290 at unloading station 250, remove DUTs 160 from test beds 220 and sort and place DUTs 160 in output bins depending on test results.

In preferred embodiments of the present invention, each test bed 220 is essentially a small adapter that holds at least one DUT. Ideally, each DUT is pre-loaded into an individual test bed 220 before testing the test bed is loaded onto pipeline test module 290. The primary function of test bed 220 is to provide an electrical interface between underlying fixture 210 and DUT 160. Additionally, signals not associated with underlying test station 190 may be applied to DUT 160 via test bed 220, thereby permitting some power and PLL signals to be provided to DUT 160 while test bed 220 moves between test stations.

Each test bed 220 is further preferably configured to remain with each DUT 160 during testing, provides one or more electrical contact points, and provides constant electrical connections in combination with handler 230. Individual test connections are provided by a corresponding test station 190. Test beds 220 further prevent wear on DUT connectors and may be disposable or reusable, depending on the particular requirements at hand.

Handler 230 moves test beds 220 and corresponding DUTs 160 from one test station 190 to another. Handler 230 must keep track of each DUT's location and be able to deliver its corresponding test bed 220 to any of the test stations 190 upon request from a controller or computer. In preferred embodiments of the present invention, handler 230 is capable of handling multiple test beds 220 and DUTs 160 simultaneously, can shuffle test beds 220 and DUTS 160 from one test station 190 to another, can provide continuous power and other electrical signals to each DUT 160, and handles test beds (not DUTs) within pipeline test module 290.

Figure 3:
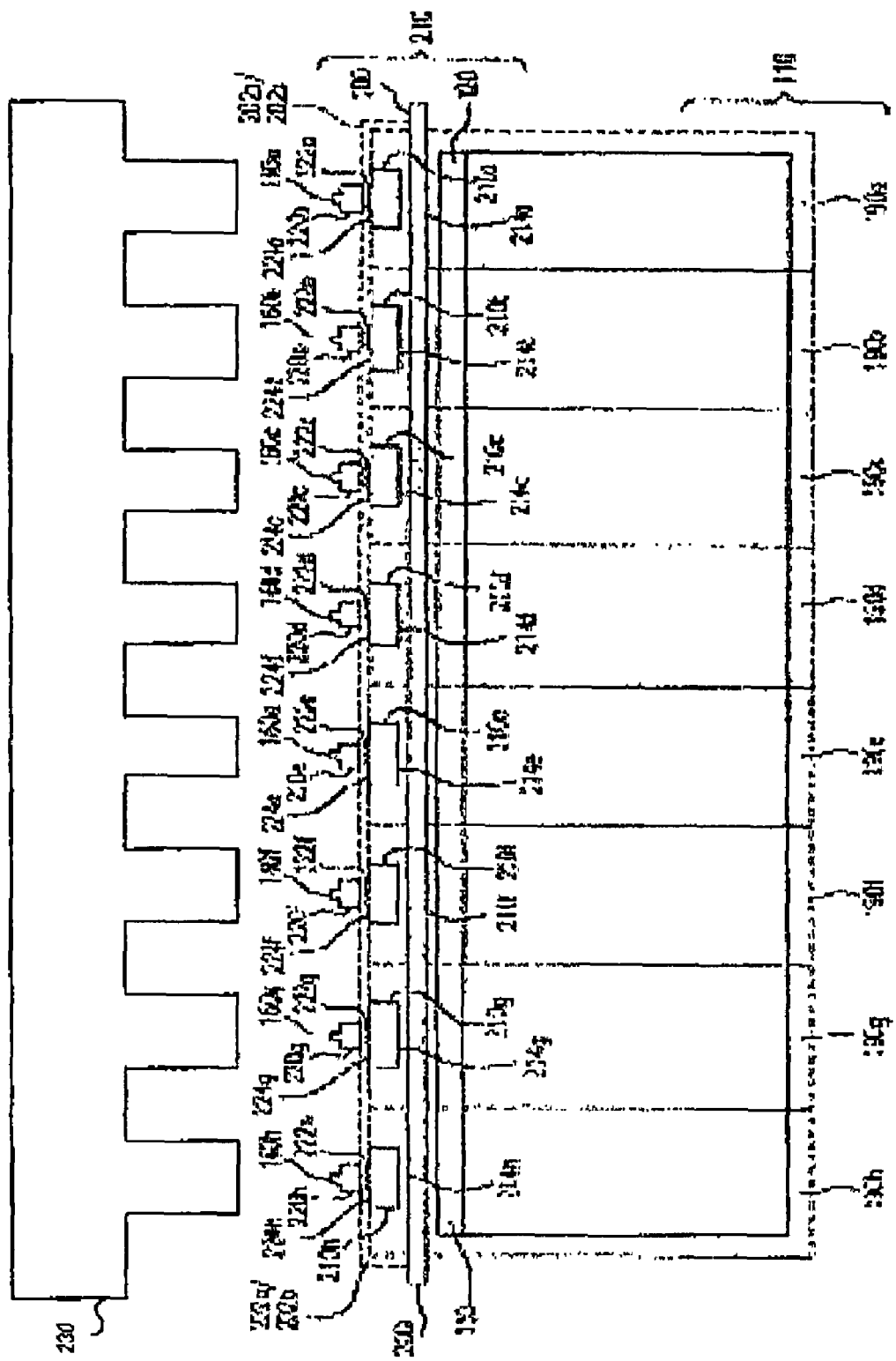
FIG. 3 shows a schematic cross-sectional view of one embodiment of a portion of a pipeline tester of the present invention.

FIG. 3 shows a schematic cross-sectional view of one embodiment of pipeline test module 290 of the present invention. As shown In FIG. 3, test head 110 comprises test stations 190a through 190h. The various embodiments of the present invention may contain between 1 and n test stations and between 1 and n corresponding fixtures. Each station performs 1 part of the test.

DUT interface 120 is positioned above test stations 190a through 190h. Pipeline test module 290 comprises load board 200, load board rails 202a and 202b, fixtures 210a through 210h, and test beds 220a through 220h. Test head 110 is partitioned into discrete test stations, each of which is configured and/or programmed to conduct a predetermined test or series of tests on a DUT electrically connected thereto and positioned directly thereabove. For example, and as shown in FIG. 3, DUT 160a is tested at station 190a and is electrically connected thereto through load board 200, fixture 210a and test bed 220a.

Load board 200 forms a portion of pipeline test module 290, and is preferably custom-configured for a particular customer's applications and the particular SOCs or DUTs that are to be tested thereon. Load board 200 is typically very application specific, and as such a particular DUT or SOC generally requires a unique set of test station capabilities (RF, Analog Digital, or mixed). Load board 200 permits all test stations 190 to be tested in parallel and also establishes mechanical and electrical connections to underlying test stations 190. In a preferred embodiment of the present invention, one or more electrical leads are provided in load board 200 to permit overlying fixture, test bed and DUT electrical contacts to be tested.

Bottom surfaces 214a through 214h of fixtures 210a through 210h are preferably mechanically and electrically attached to load board 200 and pass electrical signals therethrough which originate at DUTs 160a through 160h and/or test stations 190a through 190h. Ball-type or other suitable types of electrical contacts 222a through 222h are disposed on the top surfaces of fixtures 214a through 214h, and are preferably configured to engage corresponding electrical contact pads 226a through 226h (not shown in the Figures) disposed on the undersides of test beds 220a through 220h.

Test beds 220a through 220h are moved sequentially along load board 200 by one or more handlers 230. Fixture 214h serves as the loading point for test beds 220a through 220h and corresponding DUTs 160a through 160h loaded into test head 110 (as well as other preceding or following test beds and corresponding DUTs), while fixture 214a serves as the unloading point for the same and other test beds and DUTs. At each of test stations 190a through 190h one or more tests of a predetermined type (e.g., RF, digital, analog, mixed, etc.) are conducted on the test bed and DUT located thereabove. In preferred embodiments of the present invention, each test station 190 comprises all hardware necessary to perform one or more specific tests, and the hardware at each test station is interchangeable with the hardware of other test stations.

When a given series of tests being conducted at test stations 190a through 190h have all been completed, test beds 220a through 220h are moved along load board rails 202a and 202b to the next station, a new board is inserted between rails 202a and 202b for engagement with test station 190h, and test bed 220a is removed from test station 190a to make room for test bed 220b. After each test cycle has been completed, handler 230 shifts test beds 220 and DUTs 160 to the next test station.

One or more handlers 230 are configured to load and unload test beds and DUTs onto or from test head 110, as well as to move and register accurately the positions of the various test beds above test stations 190a through 190h such that tests of the various DUTs may be conducted effectively and efficiently. One or more handlers 230 feed DUTs onto load board 200 and remove same from load board 200. DUTs removed from load board 200 by one or more handlers 230 are typically sorted into appropriate output bins indicative of each DUTs test results (e.g., all tests passed, certain tests passed, no tests passed, etc.).

In one embodiment of the present invention, one or more handlers 230 are custom-configured to permit multiple DUTs to be tested simultaneously while one or more DUTs are being loaded onto pipeline test module 290 and one or more DUTs are being unloaded therefrom. In a preferred embodiment of the present invention, one or more handlers 230 are further configured to provide phase-lock-loop (PLL) signals, ground (GRND), supply voltages ($V_{cc}$) and/or other signals or voltages to the various DUTs loaded onto load board 200 while such DUTs are being moved from one test station to another, thereby maintaining the provision of such signals and voltages to the DUTs while the DUTs are disengaged from test stations and not in electrical contact therewith.

Handler 230 may be any one of several types, such as a line handler or a carousel handler of the type described in U.S. Pat.

No. 7,274,202, filed Oct. 7, 2005 entitled "Carousel Device, System and Method for Electronic Circuit Tester" to Kolman, the entirety of which is hereby incorporated by reference herein. Ideally, handler 230 is detachable from load board 200, but may also be affixed thereto.

Some examples of commercially-available handlers that may be adapted for use in the present invention include, but are not limited to, various SEIKO EPSON handlers, the DELTAFLEX 1210 handler, DAYMARC handlers, various TOSHIBA handlers, various TESEC handlers and various AETRIUM handlers including the AETRIUM 5050 handler employed currently in conjunction with the Agilent 84000 memory chip tester. Note that any one of the foregoing handlers must be custom-configured for use in the present invention.

Figure 4:
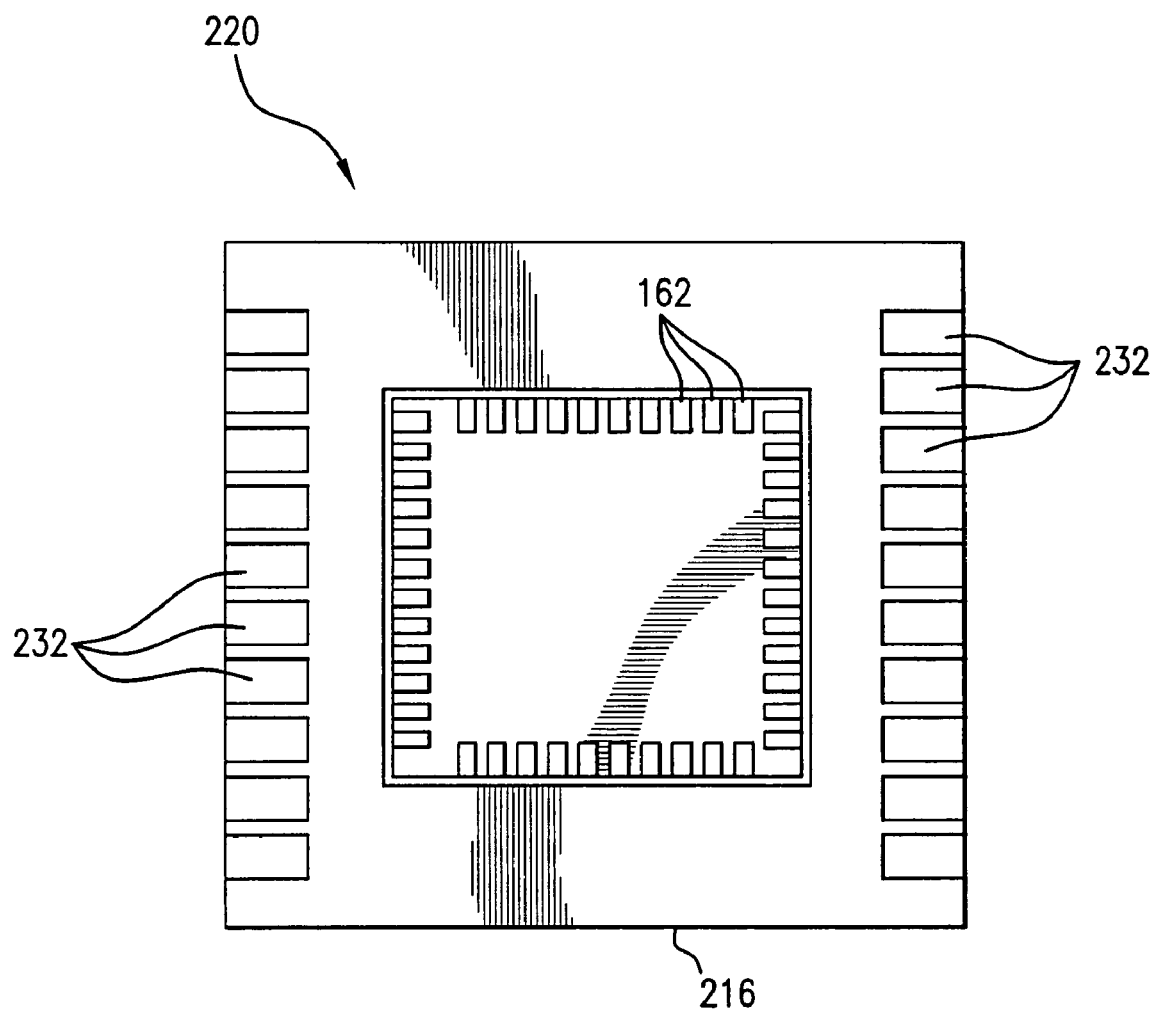
FIG. 4 shows a top view of one embodiment of test bed 220 of the present invention.

FIG. 4 shows a top view of one embodiment of test bed 220 of the present invention. Electrical contacts 232 are provided on top surface 216 of test bed 220, the contacts being configured to mechanically and electrically engage corresponding electrical contacts or pads disposed on portions of one or more handlers 230, thereby permitting desired signals or voltages to be provided continuously to DUT 160 loaded into test bed 220 while test bed 220 is being moved between test stations.

Figure 5:
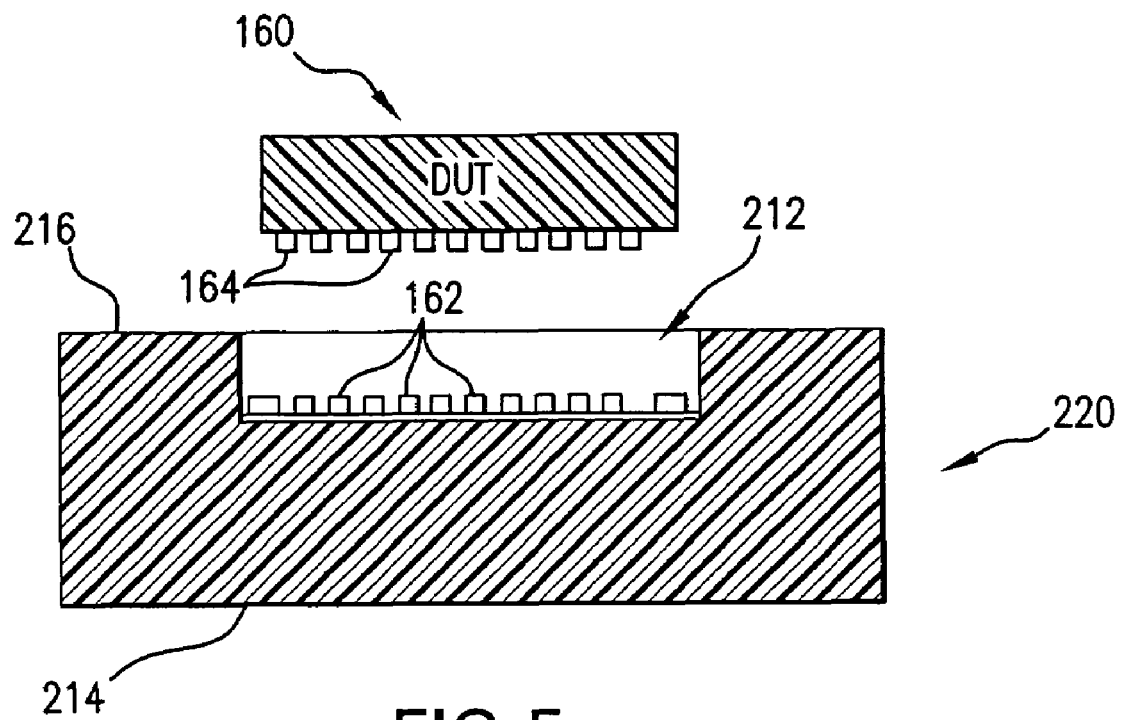
FIG. 5 shows a side view of one embodiment of test bed 220 of the present invention.

FIG. 5 shows a side view of test bed 220 shown in FIG. 4. As shown in FIG. 5, test bed 220 further comprises recess 212 within which DUT 160 is loaded and electrical contacts 162 for engaging corresponding contacts 164 in DUT 160. Bottom surface 214 of test bed contains electrical contacts 226a through 226h (not shown in the Figures) configured to engage corresponding suitable electrical contacts 222a through 222h disposed on the top surfaces of fixtures 214a through 214h.

Figure 6:
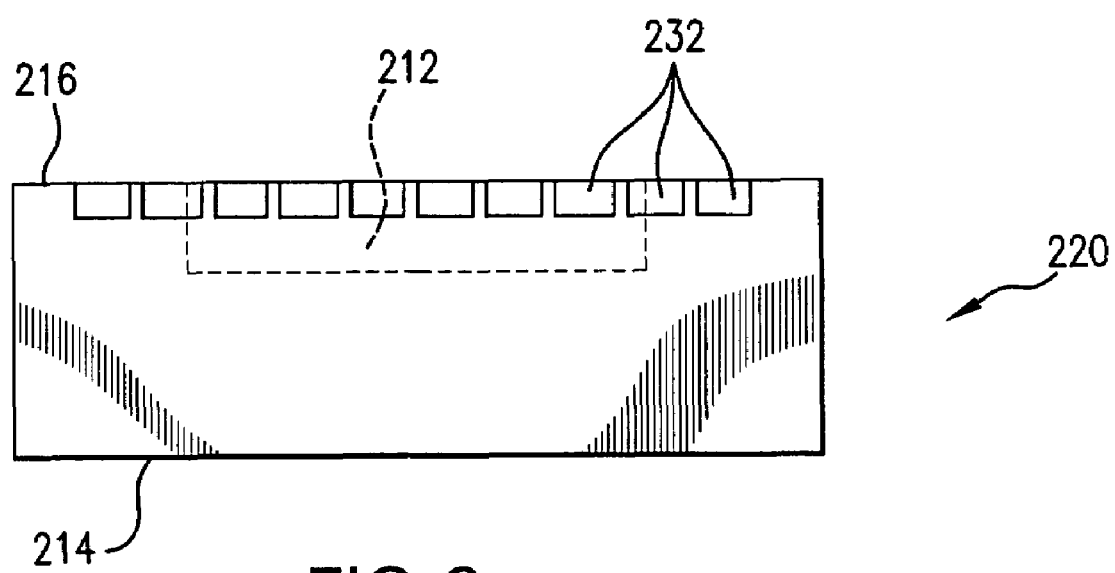
FIG. 6 shows another side view of one embodiment of test bed 220 of the present invention.

FIG. 6 shows another side view of one embodiment of test bed 220 of the present invention shown in FIGS. 4 and 5. Electrical contacts 230 for engaging corresponding electrical contacts in one or more handlers 230 are shown in FIG. 6, along with recess 212, top surface 216 and bottom surface 214.

Figure 7:
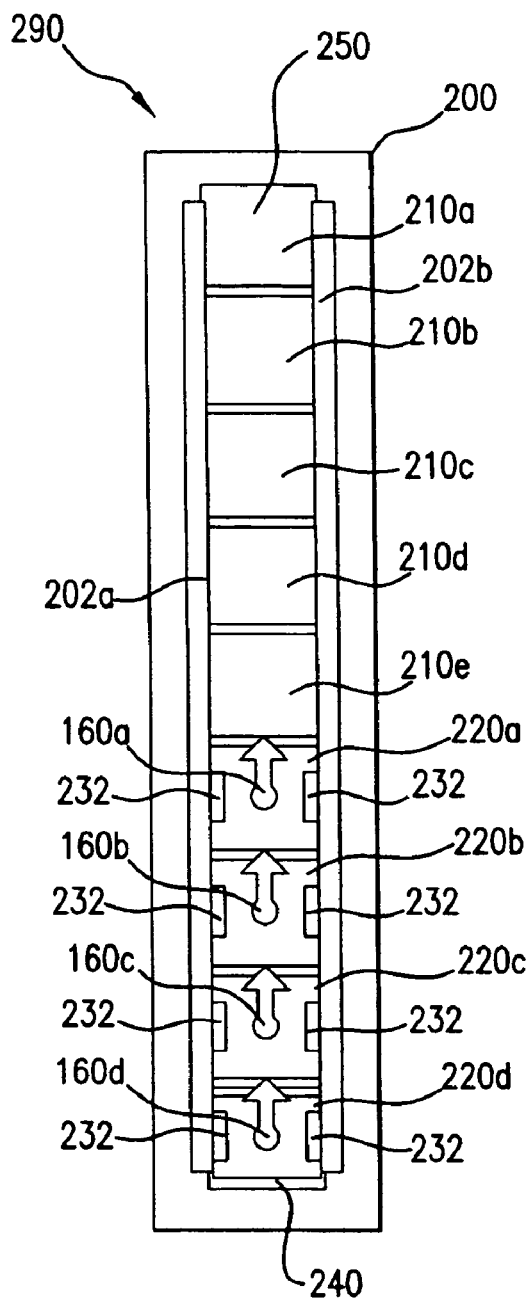
FIG. 7 shows a top view of a portion of pipeline test module 290 of the present invention with four test beds and corresponding DUTs loaded therein.
Figure 8:
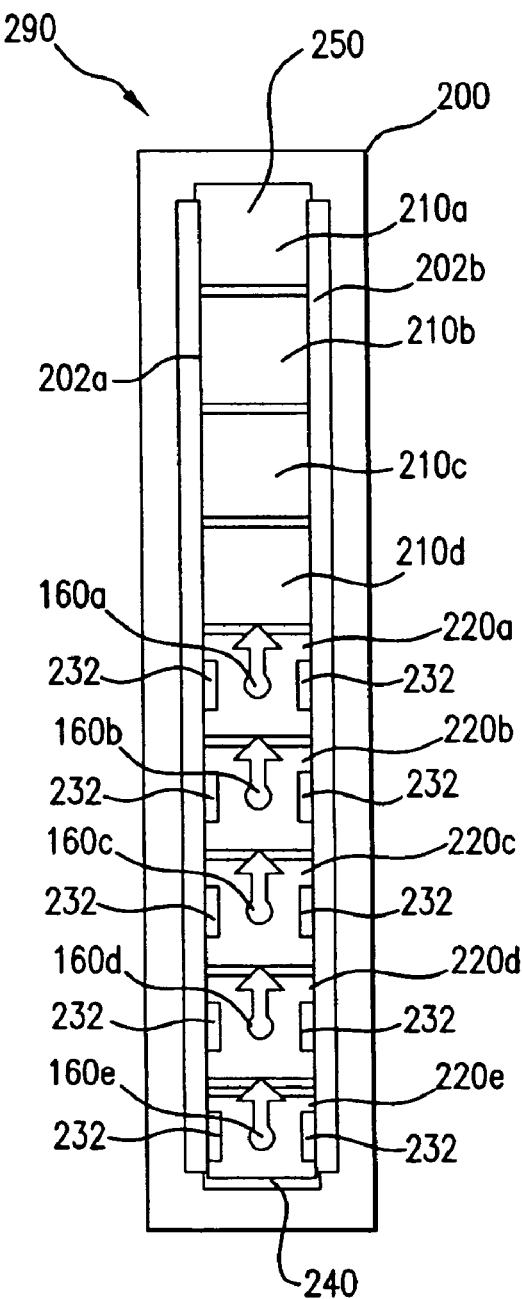
FIG. 8 shows a top view of a portion of a pipeline test module 290 of the present invention with five test beds and corresponding DUTs loaded therein.

FIGS. 7 and 8 show two different top views of a portion of pipeline test module 290 of the present invention. In FIG. 7, four test beds and corresponding DUTs are loaded in pipeline test module 290. Once testing of DUTs 160a through 160d has been completed, Handler 230 (not shown in the Figures) engages contacts 232 of test beds 220a through 220d and moves such test beds forward to align with the next test station, and also loads test bed 220e containing DUT 160e into loading station 240 (see FIG. 8). The process of loading test beds into pipeline test module 290 and testing DUTs loaded in test beds continues until pipeline test module 290 has become filled with test beds, at which point handler 230 begins not only loading test beds into pipeline test module 290 at loading station 240, but also unloading test beds from pipeline test module 290 at unloading station 250.

Note that prior to testing DUTs or SOCs of the present invention, it is preferred that each test bed be attached to its corresponding DUT or SOC during packaging operations; this is preferred because at this stage optical tests can verify electrical connections at the same time as packaging is being verified.

Still referring to FIGS. 7 and 8, at least some of the following steps are employed in preferred testing methods of the present invention. First, one or more handlers 230 and load boards 200 are prepared and attached to pipeline test module 290. Handler 230 picks up test bed 220a with DUT 160a and places it into loading station 240 of module 290. DUT 160a is tested at station 190a. Upon completion of such test, handler 230 shifts DUT 160a to the next test station 190b while another test bed 220b and corresponding DUT 160b is loaded onto module 290. The process continues, and tests are performed at all "loaded" test stations. The "Test Interval" is the total amount of time required to complete all tests at all test stations.

In preferred embodiments of the present invention, all tests are done in parallel, and the status of each test station 190 or test being conducted at each test station 190 is recorded by tester 100. The Test Interval is completed when all test stations connected to load board 200 have finished performing their tests. When a given DUT 160 and corresponding test bed 220 are ready to be unloaded, they are unloaded at unloading station 250. A DUT 160 and corresponding load bed 220 reach unloading station 250 when DUT 160 has been tested at all "required" test stations 190 for such DUT. Failure of one or more tests may cause a DUT to be unloaded before reaching unloading station 250, depending on the particular layout of test stations 190 and the capabilities of handler 230 being employed.

Examples 1 and 2 set forth below show that the pipeline test methods of the present invention can result in significant cost and time savings.

EXAMPLE 1

Prior Art Cost of Testing Using Serial Test, Single Site Methods

Cost of System: 1 Million
Cost of Handler: 300 K
Assume test time per DUT: 3 Seconds
Assume for 20-30 tests the longest test runs 200 ms
Handler Index time: 1 Second
Number of DUTs testable (single site) in 1 hr (ideal)=>900 Units/Hr
Or, a simple Cost of Test=>692 Units/Hr/(Million $)

EXAMPLE 2

Cost of Testing Using Pipeline Testing Methods of the Present Invention

Cost of System: 1 Million
Assume 20 Stations at 50 k per station for resources
Cost of Handler: 1 Million
Cost of Contactor Bases: (2-5) cents per DUT
Time per Test:
   Assume 200 ms is the time of the slowest test
   Assume 20 tests
   Assume line-handler index of 0.2 secs
   1st DUT takes approx 4.5 Secs to test
   Each subsequent DUT takes 0.4 secs
   =>0.4 secs per DUT (for a typical lot)
Number of DUT(s) testable (single site) in 1 hr (ideal)=>8990 Units/Hr
Or, a Simple Cost of Test=>4495 Units/Hr/(Million$)

As will now become apparent, while specific embodiments of pipeline test module 290, test bed 220, fixture 210, load board 200 and handler 230 are described and disclosed herein, many variations and alternative embodiments of the present invention may be constructed or implemented without departing from the spirit and scope of the present invention. It is to be understood, therefore, that the scope of the present invention is not to be limited to the specific embodiments disclosed herein, but is to be determined by looking to the appended claims and their equivalents. Consequently, changes and modifications may be made to the particular embodiments of the present invention disclosed herein without departing from the spirit and scope of the present invention as defined in the appended claims.

We claim:

1. A system-on-a-chip pipeline tester, comprising:
   (a) a plurality of test stations, each station being configured to conduct one or more tests on a system-on-a-chip;
   (b) a plurality of test fixtures, each test fixture corresponding to a predetermined test station and being electrically and mechanically attachable thereto;
   (c) a plurality of test beds, each test bed being configured to receive at least one DUT, each test bed corresponding to a predetermined test fixture and being electrically and mechanically attachable thereto;
   wherein the tester is configured to pipeline test a plurality of DUTs loaded into the test beds; and
   wherein each test bed is configured to maintain the provision of electrical power and other signals to its corresponding DUT while the test bed is moved from one test station to another.

2. The system of claim 1, wherein electrical contacts or pads are disposed atop each test station to establish electrical contact with a corresponding overlying test fixture.

3. The system of claim 1, further comprising one or more handlers configured to place DUTs in the plurality of test beds.

4. The system of claim 3, wherein the one or more handlers are configured to load the plurality of test beds in the tester.

5. The system of claim 4, wherein the one or more handlers are configured to unload the plurality of test beds from the tester.

6. The system of claim 5, wherein the one or more handlers are configured to sort and place DUTs in output bins depending on test results.

7. The system of claim 1, further comprising one or more load handlers configured to provide phase-lock-loop (PLL) signals, ground (GRND), supply voltages ($V_{cc}$) and/or other signals or voltages to the test beds while such test beds are being moved from one test station to another, thereby maintaining the provision of such signals and voltages to the DUTs loaded in the test beds while the test beds are disengaged from test stations and not in electrical contact therewith.

8. The system of claim 1, wherein each test bed is configured to remain with its corresponding DUT during testing.

9. The system of claim 1, wherein each test bed comprises one or more electrical contact points configured to engage corresponding electrical contact points or connectors on one or more handlers.

10. The system of claim 1, wherein one or more of the plurality of test beds is disposable.

11. The system of claim 1, wherein one or more of the plurality of test beds is reusable.

12. The system of claim 1, further comprising at least one of a computer and a controller that is configured to keep track of each DUT's location as the DUT moves through the pipeline tester.

13. The system of claim 1, further comprising at least one of a computer and a controller that is configured, in combination with one or more handlers, to deliver a test bed to a selected test station.

14. The system of claim 1, further comprising at least one of a computer and a controller that is configured, in combination with one or more handlers, to shuffle a selected test bed from one test station to another.

15. The system of claim 1, wherein each test station is configured or programmed to conduct a predetermined test or series of tests on a DUT electrically connected thereto and positioned thereabove.

16. The system of claim 1, further comprising a load board.

17. The system of claim 1, further comprising one or more handlers selected from a group consisting of a line handler and a carousel handler.

18. The system of claim 1, further comprising a load board and one or more handlers, the one or more handlers being affixed to the load board.

19. The system of claim 1, further comprising a load board and one or more handlers, the one or more handlers being attachable to and detachable from the load board.

20. The system of claim 1, wherein the tester is configured to conduct electrical or electronic tests in parallel at one or more test stations.

21. A method of pipeline testing a plurality of DUTs using a system-on-a-chip pipeline tester, the tester comprising a plurality of test stations, each station being configured to conduct one or more tests on a system-on-a-chip, a plurality of test fixtures, each test fixture corresponding to a predetermined test station and being electrically and mechanically attachable thereto, a plurality of test beds, each test bed being configured to receive at least one DUT, each test bed corresponding to a predetermined test fixture and being electrically and mechanically attachable thereto, the tester being configured to pipeline test the plurality of DUTs loaded into the test beds, the method comprising:
   (a) loading a first DUT in a first test bed;
   (b) loading the first test bed in the tester;
   (c) moving the first test bed to a first test station;
   (d) performing a first electrical or electronic test on the first DUT at the first test station;
   (e) moving the first test bed to a second test station;
   (f) loading a second DUT in a second test bed;
   (g) moving the second test bed to the first test station;
   (h) performing the first electrical or electronic test on the second DUT at the first test station;
   (i) performing a second electrical or electronic test on the first DUT at the second test station; and
   (j) maintaining the provision of electrical power and other signals to each test bed as the test beds are moved from one test station to another.

22. The method of claim 21, further comprising unloading the first test bed from the tester.

23. The method of claim 21, further comprising moving the second test bed to the second test station.

24. The method of claim 23, further comprising performing the second electrical or electronic test on the second DUT at the second test station.

25. The method of claim 24, further comprising unloading the second test bed from the tester.

26. The method of claim 21, further comprising using one or more handlers to place DUTs in the plurality of test beds.

27. The method of claim 21, further comprising using one or more handlers to load the plurality of test beds in the tester.

28. The method of claim 21, further comprising using one or more handlers to unload the plurality of test beds from the tester.

29. The method of claim 21, further comprising using one or more handlers to sort and place DUTs in output bins depending on test results.

30. The method of claim 21, further comprising using one or more handlers configured to provide phase-lock-loop (PLL) signals, ground (GRND), supply voltages ($V_{cc}$) and/or other signals or voltages to the test beds while the test beds are being moved from one test station to another, thereby maintaining the provision of such signals and voltages to the DUTs loaded in the test beds while the test beds are disengaged from test stations and not in electrical contact therewith.

31. The method of claim 21, further comprising using at least one of a computer and a controller to keep track of the location of each DUT as the DUT moves through the pipeline tester.

32. The method of claim 21, further comprising using at least one of a computer and a controller, in combination with one or more handlers, to deliver a test bed to a selected test station.

33. The method of claim 21, further comprising using at least one of a computer and a controller, in combination with one or more handlers, to shuffle a selected test bed from one test station to another.

34. The method of claim 21, further comprising using configuring or programming each test station to conduct a predetermined test or series of tests on a DUT electrically connected thereto and positioned thereabove.

35. The method of claim 21, further comprising configuring the tester to conduct electrical or electronic tests in parallel at the plurality of test stations.

* * * * *